US011419224B1

(12) United States Patent
Wang et al.

(10) Patent No.: US 11,419,224 B1
(45) Date of Patent: Aug. 16, 2022

(54) ELECTRONIC ASSEMBLY

(71) Applicants: Inventec (Pudong) Technology Corporation, Shanghai (CN); INVENTEC CORPORATION, Taipei (TW)

(72) Inventors: Wei Wang, Shanghai (CN); Zhao Geng, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 12 days.

(21) Appl. No.: 17/208,070

(22) Filed: Mar. 22, 2021

(30) Foreign Application Priority Data

Feb. 20, 2021 (CN) .......................... 202110194296.5

(51) Int. Cl.
*H05K 5/00* (2006.01)
*H05K 5/02* (2006.01)

(52) U.S. Cl.
CPC ......... *H05K 5/0026* (2013.01); *H05K 5/0221* (2013.01); *H05K 5/0286* (2013.01)

(58) Field of Classification Search
None
See application file for complete search history.

(56) References Cited

U.S. PATENT DOCUMENTS

| 9,042,110 | B2* | 5/2015 | Kuo | G11B 33/124 |
| | | | | 361/756 |
| 9,801,299 | B1* | 10/2017 | Chen | G06F 1/187 |
| 10,765,038 | B1* | 9/2020 | Leigh | H05K 7/20772 |
| 10,847,188 | B1* | 11/2020 | Liu | H05K 7/1487 |
| 2002/0122296 | A1* | 9/2002 | Stone | H05K 7/20836 |
| | | | | 361/679.48 |
| 2005/0057895 | A1* | 3/2005 | Chen | G06F 1/184 |
| | | | | 361/679.33 |
| 2006/0227525 | A1* | 10/2006 | Hoshino | G06F 1/185 |
| | | | | 361/801 |
| 2009/0296338 | A1* | 12/2009 | Peng | G11B 33/121 |
| | | | | 248/231.9 |
| 2011/0194242 | A1* | 8/2011 | Hu | G06F 1/187 |
| | | | | 361/679.33 |
| 2012/0051024 | A1* | 3/2012 | Mo | G06F 1/183 |
| | | | | 361/814 |
| 2013/0313955 | A1* | 11/2013 | Kuo | H05K 5/0017 |
| | | | | 312/223.2 |
| 2017/0147042 | A1* | 5/2017 | Liu | G11B 33/128 |
| 2018/0181514 | A1* | 6/2018 | Morgan | G06F 1/16 |

* cited by examiner

*Primary Examiner* — Xanthia C Cunningham
(74) *Attorney, Agent, or Firm* — Locke Lord LLP; Tim Tingkang Xia, Esq.

(57) ABSTRACT

An electronic assembly including a disk drive mount, a circuit board, a first tray and an expansion card. The disk drive mount has an accommodation space. The circuit board is fixed to the disk drive mount. The first tray is removably mounted in the disk drive mount and located in the accommodation space. The expansion card is fixed in the first tray and electrically connected to the circuit board.

10 Claims, 2 Drawing Sheets

ELECTRONIC ASSEMBLY

CROSS-REFERENCE TO RELATED APPLICATIONS

This non-provisional application claims priority under 35 U.S.C. § 119(a) on Patent Application No(s). 202110194296.5 filed in China, on Feb. 20, 2021, the entire contents of which are hereby incorporated by reference.

BACKGROUND OF THE INVENTION

Technical Field of the Invention

The invention relates to an electronic assembly, more particularly to an electronic assembly including a disk drive mount and an expansion card.

Description of the Related Art

In order to suit users' different requirements for a server, an expansion card is usually disposed in a server chassis to increase the performance of the server or to expand the function of the server. In addition, such expansion card is commonly electrically connected to a motherboard via one or more additional cables.

However, the additional cables disposed in the limited space in the server chassis not only disturb a heat dissipation airflow flowing in the server chassis and thus adversely affect the heat dissipation of the server, but also increase the difficulty of the cable management in the server chassis.

SUMMARY OF THE INVENTION

The invention is to provide an electronic assembly that can prevent the heat dissipation airflow flowing in the server chassis to be disturbed by additional cables and facilitate the cable management in the server chassis.

One embodiment of this invention provides an electronic assembly including a disk drive mount, a circuit board, a first tray and an expansion card. The disk drive mount has an accommodation space. The circuit board is fixed to the disk drive mount. The first tray is removably mounted in the disk drive mount and located in the accommodation space. The expansion card is fixed in the first tray and electrically connected to the circuit board.

According to the electronic assembly disclose by the above embodiments, the first tray is fixed on the disk drive mount and located in the accommodation space of the disk drive mount, and the expansion card is fixed in the disk drive mount via the first tray. Also, the expansion card is electrically connected to the circuit board that is fixed in the disk drive mount. In this way, the expansion card is installed in an existing disk drive mount so that the installation of the expansion card does not require any additional structure, thereby reducing the cost for installing the expansion card. Also, there is no need to use additional cables to electrically connect the expansion card with the circuit board, such that the space in the server chassis is not occupied by such cables, and thus the heat dissipation airflow flowing in the server chassis is prevented from being disturbed by it and the cable management in the server chassis is facilitated.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
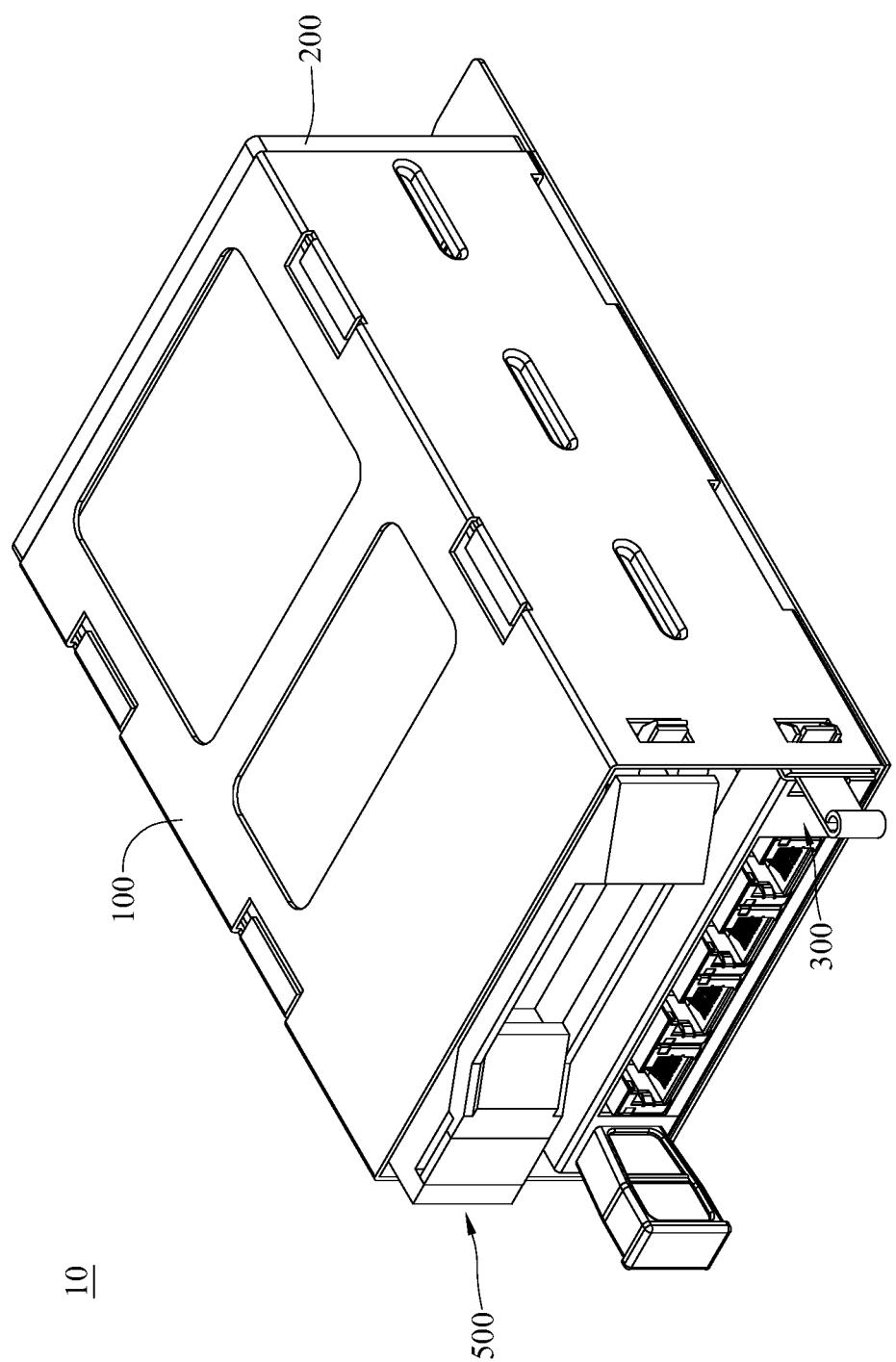
FIG. 1 is a perspective view of an electronic assembly according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
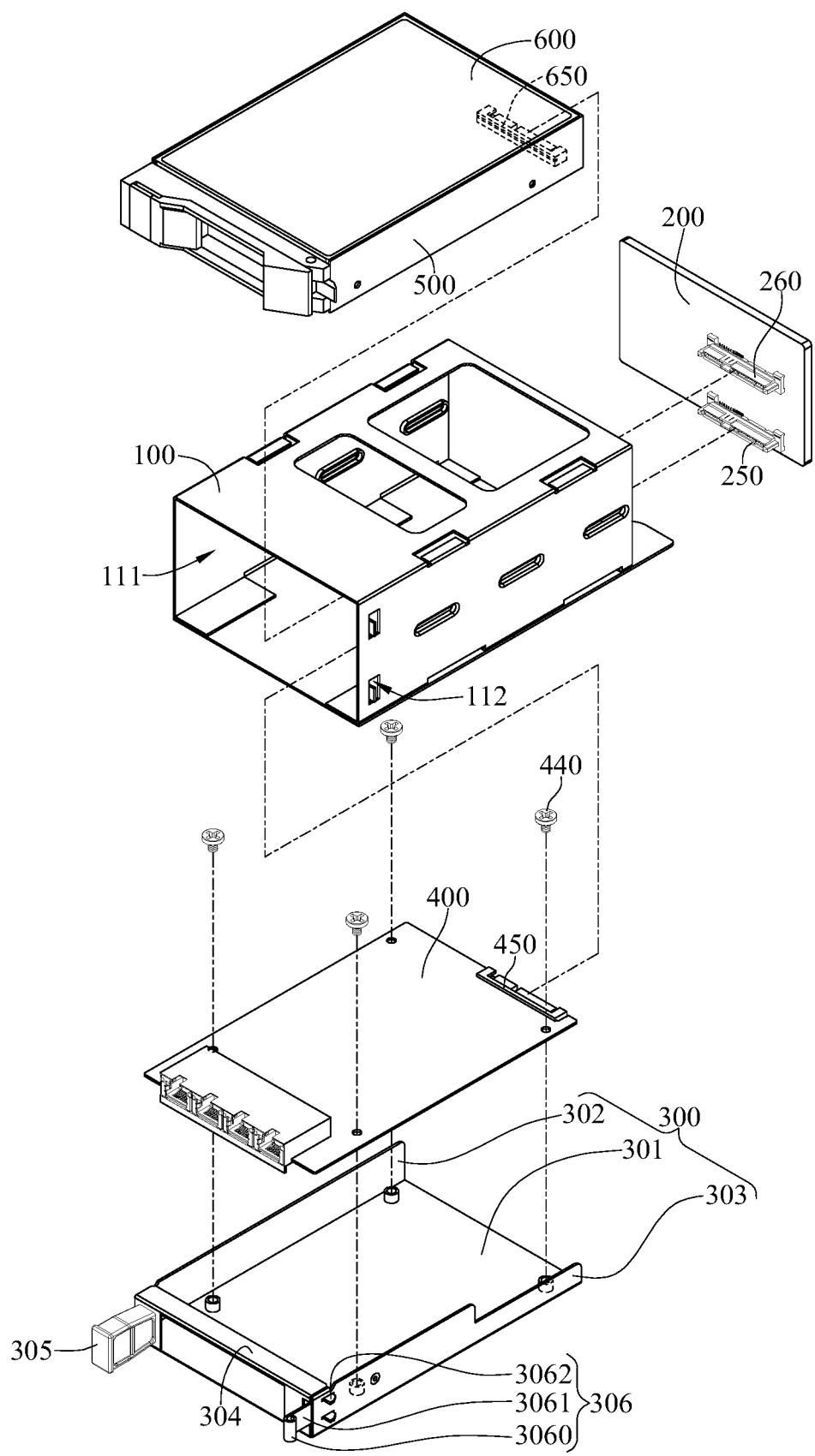
FIG. 2 is an exploded view of the electronic assembly in FIG. 1.

Please refer to FIGS. 1 and 2. FIG. 1 is a perspective view of an electronic assembly 10 according to one embodiment of the invention. FIG. 2 is an exploded view of the electronic assembly 10 in FIG. 1.

In this embodiment, the electronic assembly 10 includes a disk drive mount 100, a circuit board 200, a first connector 250, a second connector 260, a first tray 300, an expansion card 400, a plurality of fasteners 440, a third connector 450, a second tray 500, a storage device 600 and a fourth connector 650.

In this embodiment, the disk drive mount 100 has an accommodation space 111 and an engagement hole 112 connected to the accommodation space 111. The disk drive mount 100 is configured to be fixed on, for example, a server chassis. The circuit board 200 is fixed on the disk drive mount 100. In this embodiment, the circuit board 200 is located outside the accommodation space 111, but the invention is not limited thereto. In other embodiments, the circuit board may be located in the accommodation space. The first connector 250 and the second connector 260 are fixed on and electrically connected to the circuit board 200. The first connector 250 and the second connector 260 are located on the same side of the circuit board 200 and are arranged side by side.

In this embodiment, the first tray 300 is located in the accommodation space 111 and includes a bottom plate 301, a first side plate 302, a second side plate 303, a front window 304, a handle 305 and a latch 306. The first side plate 302 and the second side plate 303 stand on the bottom plate 301 and are spaced apart from each other. The front window 304 stands on a side of the bottom plate 301 and connects the first side plate 302 and the second side plate 303. The handle 305 protrudes from the front window 304 and is located adjacent to the first side plate 302, such that the first tray 300 can be moved by pulling the handle 305, thereby facilitating the movement of the first tray 300 by the handle 305. The latch 306 is elastic and includes a held part 3060, a connection part 3061 and an engagement part 3062. The held part 3060 and the engagement part 3062 are connected to two opposite sides of the connection part 3061, respectively. The engagement part 3062 is disposed on the second side plate 303 and removably engaged with the engagement hole 112.

Note that, in other embodiments, the first tray may not include the front window 304. In other embodiments, the first tray may not include the handle 305. In other embodiments, the first tray may not include the latch 306, and the first tray and the disk drive mount may be fixed to each other via one or more screws.

In this embodiment, the expansion card 400 is fixed on the bottom plate 301 of the first tray 300 via the fasteners 440. In this embodiment, the expansion card 400 includes, for example, an Inter-Integrated Circuit Bus (I2C). In this embodiment, the fasteners 440 are, for example, screws. The third connector 450 is fixed on and electrically connected to the expansion card 400. The third connector 450 is plugged into the first connector 250 so that the expansion card 400 and the circuit board 200 are electrically connected.

In other embodiments, the electronic assembly may not include the fasteners 440, and the position of the expansion card may be fixed via the connection between the third connector and the first connector.

In this embodiment, the second tray 500 is removably mounted on the disk drive mount 100. The first tray 300 and the second tray 500 are arranged side by side in the accommodation space 111. In addition, in this embodiment, an overall size of the first tray 300 is substantially the same as an overall size of the second tray 500, but the invention is not limited thereto. In other embodiments, the overall size of the first tray may be different from the overall size of the second tray.

In this embodiment, the storage device 600 is fixed on the second tray 500. The fourth connector 650 is fixed on and electrically connected to the storage device 600. The fourth connector 650 is plugged into the second connector 260 so that the storage device 600 and the circuit board 200 are electrically connected with each other.

Note that, in other embodiments, the electronic assembly may not include the second tray 500 and the storage device 600.

In this embodiment, the first connector 250, the second connector 260, the third connector 450 and the fourth connector 650 are, for example, U.2 connectors.

In other embodiments, the electronic assembly may not include the first connector, the second connector, the third connector and the fourth connector, and the expansion card and the storage device may be electrically connected to the circuit board via one or more cables.

According to the electronic assembly disclose by the above embodiments, the first tray is fixed on the disk drive mount and located in the accommodation space of the disk drive mount, and the expansion card is fixed in the disk drive mount via the first tray. Also, the expansion card is electrically connected to the circuit board that is fixed in the disk drive mount. In this way, the expansion card is installed in an existing disk drive mount so that the installation of the expansion card does not require any additional structure, thereby reducing the cost for installing the expansion card. Also, there is no need to use additional cables to electrically connect the expansion card with the circuit board, such that the space in the server chassis is not occupied by such cables, and thus the heat dissipation airflow flowing in the server chassis is prevented from being disturbed by it and the cable management in the server chassis is facilitated.

Furthermore, with the cooperation of the latch and the engagement hole of the disk drive mount, the first tray can be installed in or removed from the disk drive mount in a tool-less manner, achieving the hot plugging of the expansion card disposed on the first tray.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. An electronic assembly, comprising:
a disk drive mount, having an accommodation space;
a circuit board, fixed to the disk drive mount;
a first tray, removably mounted in the disk drive mount and located in the accommodation space; and
an expansion card, fixed in the first tray and electrically connected to the circuit board.

2. The electronic assembly according to claim 1, further comprising a second tray and a storage device, wherein the second tray is removably mounted in the disk drive mount, the first tray and the second tray are arranged side by side in the accommodation space, the storage device is fixed in the second tray and electrically connected to the circuit board.

3. The electronic assembly according to claim 2, wherein a size of the first tray is substantially the same as a size of the second tray.

4. The electronic assembly according to claim 2, further comprising a first connector, a second connector, a third connector and a fourth connector, wherein the first connector and the second connector are fixed on and electrically connected to the circuit board, the first connector and the second connector are located on a side of the circuit board and are arranged side by side, the third connector is fixed on and electrically connected to the expansion card, the third connector is plugged into the first connector, the fourth connector is fixed on and electrically connected to the storage device, the fourth connector is plugged into the second connector.

5. The electronic assembly according to claim 3, wherein the first connector, the second connector, the third connector and the fourth connector are U.2 connectors.

6. The electronic assembly according to claim 1, further comprising a plurality of fasteners, the expansion card fixed to the first tray via the plurality of fasteners.

7. The electronic assembly according to claim 1, wherein the first tray comprises a bottom plate, a first side plate, a second side plate and a front window, the first side plate and the second side plate stand on the bottom plate and are spaced apart from each other, the front window stands on a side of the bottom plate and connects the first side plate and the second side plate, the expansion card is fixed on the bottom plate.

8. The electronic assembly according to claim 7, wherein the first tray further comprises a handle, the handle protrudes from the front window and is located adjacent to the first side plate.

9. The electronic assembly according to claim 7, wherein the first tray further comprises a latch, the disk drive mount further comprises an engagement hole, the engagement hole is connected to the accommodation space, the latch includes a held part, a connection part and an engagement part, the held part and the engagement part are respectively connected to two opposite sides of the connection part, the engagement part is fixed to the second side plate and removably engaged with the engagement hole of the disk drive mount.

10. The electronic assembly according to claim 1, wherein the circuit board is located outside the accommodation space.

* * * * *